(12) United States Patent
Sakai et al.

(10) Patent No.: US 6,204,199 B1
(45) Date of Patent: Mar. 20, 2001

(54) METHOD FOR PRODUCING A SEMICONDUCTOR DEVICE

(75) Inventors: Masanori Sakai; Masayuki Tsuneda; Naoko Matsuyama; Hideharu Itatani; Michihide Nakamure, all of Tokyo (JP)

(73) Assignee: Kokusai Electric Co., Ltd., Tokyo (JP)

( * ) Notice: Subject to any disclaimer, the term of this patent is extended or adjusted under 35 U.S.C. 154(b) by 0 days.

(21) Appl. No.: 09/393,276

(22) Filed: Sep. 10, 1999

(30) Foreign Application Priority Data

Sep. 11, 1998 (JP) .................................................. 10-258990
Mar. 30, 1999 (JP) .................................................. 11-090035
Aug. 2, 1999 (JP) .................................................. 11-219132

(51) Int. Cl.$^7$ .................................................. H01L 21/02
(52) U.S. Cl. ......................... 438/774; 438/758; 438/785; 257/632
(58) Field of Search .................. 438/785, 758, 438/774; 257/632

(56) References Cited

U.S. PATENT DOCUMENTS 5,254,505 * 10/1993 Kamiyama ............................ 438/235

FOREIGN PATENT DOCUMENTS

| 7-14773 | 1/1995 | (JP) . |
| 7-94419 | 4/1995 | (JP) . |
| 8-31743 | 2/1996 | (JP) . |
| 2809817 | 7/1998 | (JP) . |
| 11-219908 | 8/1999 | (JP) . |

* cited by examiner

Primary Examiner—Charles Bowers
Assistant Examiner—Lisa Kilday
(74) Attorney, Agent, or Firm—McGinn & Gibb, PLLC (57) ABSTRACT

A method and apparatus for producing a semiconductor device can provide a uniform film on a substrate. A substrate is introduced into a reaction chamber or tube (51) which has gas feed ports (52, 53) and gas exhaust ports (54, 55). The substrate in the reaction tube (51) is heated to substantially a film forming temperature while supplying a prescribed gas to the reaction tube (51) through the gas feed ports (52, 53) and exhausting the prescribed gas from the reaction tube (51) through all the exhaust ports (54, 55). A film-forming gas is supplied to the reaction tube (51) to form a film on the substrate. The substrate with the film formed thereon is taken out of the reaction tube (51). Moreover, after the film formation on the substrate, a prescribed gas is supplied to the reaction tube (51) from the gas feed ports (52, 53) while being exhausted from the reaction tube (51) through all the exhaust ports (54, 55), thereby removing a residual gas in the reaction tube.

19 Claims, 4 Drawing Sheets

METHOD FOR PRODUCING A SEMICONDUCTOR DEVICE

BACKGROUND OF THE INVENTION

1. Field of the Invention

This invention relates to a film forming method in which a substrate is introduced into a reaction chamber having a gas feed port and a gas exhaust port, subjected to predetermined processing and taken out of the reaction chamber. More specifically, it relates to a film forming method in which nonuniformity or irregularities in a film formed on the substrate can be prevented by precluding film-forming gas components, which have been attached to the gas exhaust port and then evaporated therefrom as a film-forming gas, from flowing back to the reaction chamber.

Throughout the description which follows, the term "an exhaust port" refers to an exhaust port and its vicinity in which the exhaust port is connected with a reaction chamber or tube.

2. Description of the Prior Art

When thin layers or films are to be formed on a substrate, a film forming apparatus of a sheet-fed type has been used for example. The term "sheet-fed type", used broadly herein, means that one or more sheets of substrates are simultaneously processed in a successive manner. As a concrete example of such a film forming apparatus, a description will be made of the formation of tantalum oxide ($Ta_2O_5$) films on a substrate. Generally, tantalum oxide films are formed by use of a chemical vapor deposition (CVD) process.

Figures 5, 6:
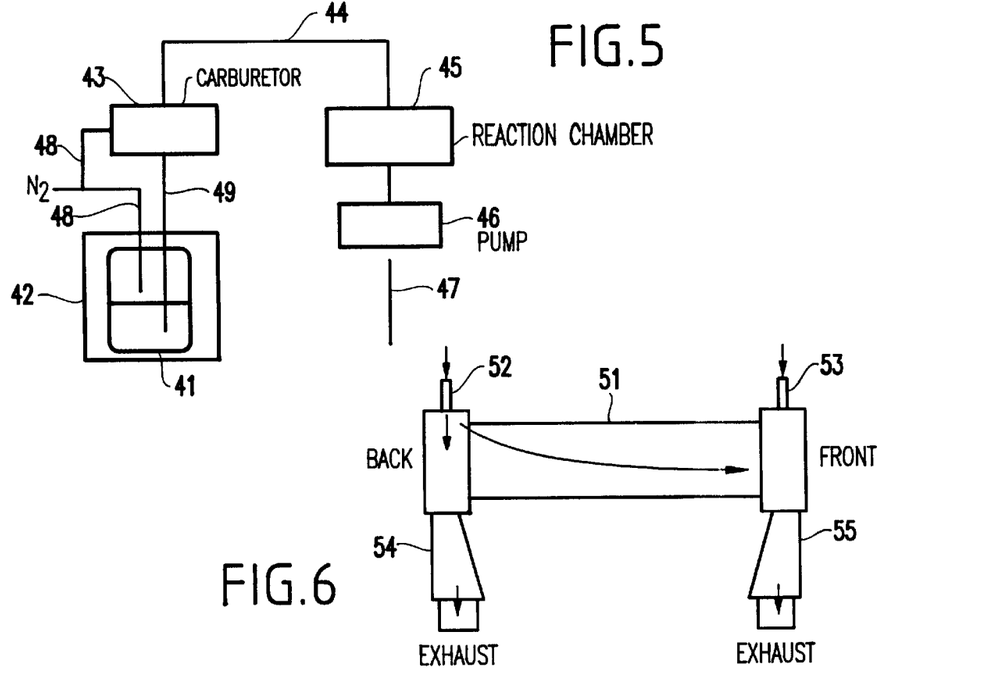
FIG. 5 is a schematic view illustrating one example of a prior art apparatus for producing a tantalum oxide film.
FIG. 6 is a view illustrating a reaction tube of a semiconductor processing apparatus described in Japanese Patent Application Laid-Open No. Hei 7-94419.

FIG. 5 is a schematic view showing an example of a conventional tantalum oxide film producing apparatus. Penta-ethoxy-tantalum in a liquid state is used as a raw material for tantalum oxide films. The penta-ethoxy-tantalum liquid is received in a tank 41 which is located in a thermostatic chamber 42. The temperature of the tank 41 is controlled to a constant value such as, for example, 35 degrees C by means of the thermostatic chamber 42. The interior of the tank 41 is pressurized by a nitrogen ($N_2$) gas supplied thereto through a nitrogen feed pipe 48 to push out the penta-ethoxy-tantalum liquid into a material feed pipe 49. The penta-ethoxy-tantalum liquid is then supplied from the material feed pipe 49 to a carburetor 43, into which a nitrogen carrier gas is supplied from the nitrogen feed pipe 48. The film-forming gas evaporated by the carburetor 43 is introduced, together with the nitrogen carrier gas, into a reaction chamber 45 through a feed pipe 44. Simultaneously, an oxygen gas is also introduced from an oxygen tank (not shown) into the reaction chamber 45, in which the penta-ethoxy-tantalum liquid is thermally decomposed to form a tantalum oxide film on the substrate. After the film formation, the atmosphere or gases in the reaction chamber 45 is exhausted by means of a discharge pump 46 through an exhaust pipe 47.

In the prior art technology described above, in order to provide a uniform formation of a tantalum oxide film on a substrate, certain proposals have been made for the configuration of the reaction chamber 45, an introduction recipe of the film-forming gas, an exhaust recipe thereof, etc.

For example, Japanese Patent Application Laid-Open No. Hei 7-94419 discloses a semiconductor processing apparatus in which a flat reaction tube is disposed in a heating space defined by a pair of parallel plate heaters, and a substrate to be processed is introduced into the flat reaction tube and subjected to a film forming processing therein. In this semiconductor processing apparatus, the flat reaction tube is provided at its opposite ends with gas feed ports and exhaust ports, so that during the film forming processing, the direction of flow of a reaction gas, which is supplied from the gas feed ports to the reaction tube and exhausted therefrom through the exhaust ports, can be changed arbitrarily.

FIG. 6 illustrates a reaction chamber or tube 51 and its related portions of the semiconductor processing apparatus as disclosed in the above reference. In this figure, an unillustrated substrate is horizontally disposed substantially in the center of the interior of the reaction tube 51, and gas feed ports 52, 53 and gas exhaust ports 54, 55 are provided at opposite ends of the reaction tube 51, the gas feed ports 52, 53 being opposed with respect to the gas exhaust ports 54, 55, respectively, with the substrate being interposed therebetween. For example, a gas supplied from the gas feed port 52 passes through the reaction tube 51 substantially in parallel with the substrate to be exhausted from the gas exhaust port 55, as indicated by an arrow in FIG. 6. At this time, the gas feed port 53 and the gas exhaust port 54 are both closed by unillustrated valves, respectively, to interrupt the passage of the gas. With this conventional apparatus, the direction of the gas flow can be set reversely so that a gas is supplied from the gas feed port 53 to the reaction tube 51 and exhausted from the gas exhaust port 54 while closing the gas feed port 52 and the gas exhaust port 55.

A conventional film-forming recipe for forming a tantalum oxide film on a substrate by use of the semiconductor processing apparatus as disclosed in the above-mentioned Japanese Patent Laid-Open No. Hei-94419 will now be described while referring to the accompanying drawings.

Figure 7A:
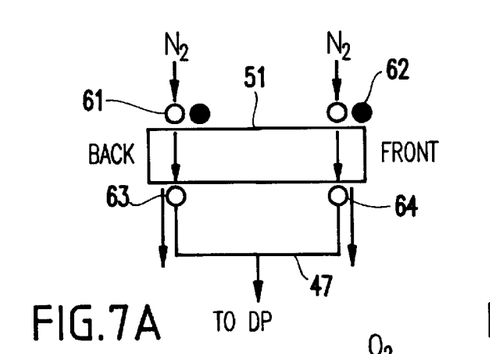
Figure 7B:
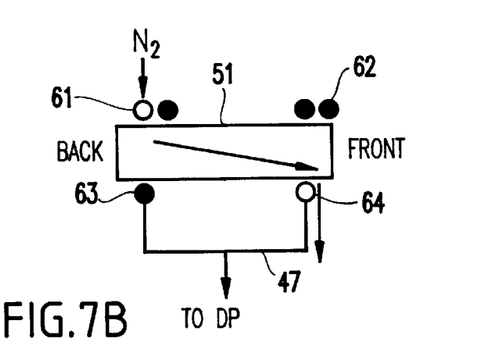
Figure 7C:
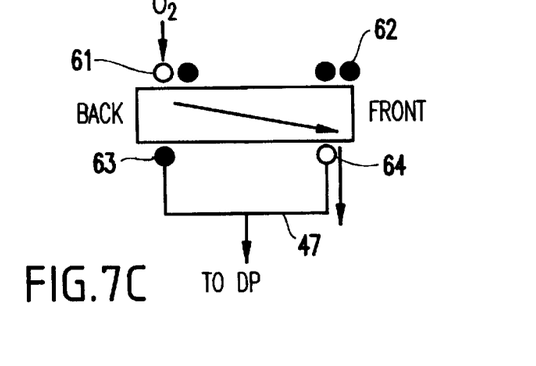

FIGS. 7(a) through 7(c) illustrate the various states of ventilation or gas flows in the reaction tube 51 from a stand-by state to the end of a substrate heating step. Here, note that the substrate heating step is to heat, prior to the formation of a film thereon, the substrate to a desired temperature by a heater (not shown) and to being a surface (i.e., film-forming surface) of the substrate into a uniform state. Preferably, the heater is an electric resistance heater, and it is preferred to employ a hot-wall type heating system in which the temperature of the reaction chamber is held at the desired temperature before the introduction of the substrate into the reaction chamber. The heater may, of course, be a lamp, a high frequency heater, and the like.

In these figures, note that the opening state and the closing state of each gas feed port and each gas exhaust port are indicated by a white circle (valve opening) and a black circle (valve closing), respectively; that the presence of two of white circles and/or black circles indicates the degree or extent of opening or closing of these ports; and that arrows with no symbols designate gas flows. Also, one of the gas feed ports and the gas exhaust ports provided at one end (e.g., at the left side of FIGS. 7(a) through 7(c)) of the reaction tube 51 is designated by the term "back-side", and the other of the gas feed ports and the gas exhaust ports provided at the other end (e.g., at the right side of FIGS. 7(a) through 7(c)) of the reaction tube 51 is designated by the term "front-side".

FIG. 7(a) shows the flow of a gas in the apparatus of the stand-by state. In this stand-by state, valves 61 through 64 respectively opening and closing the ports 52 through 55 (see FIG. 6) are adjusted such that a nitrogen gas flows in a direction from the back-side feed port to the back-side exhaust port and further from front-side feed port to the front-side exhaust port. The gas passing the reaction tube 51 is discharged to the outside by means of a discharge pump (DP) through the exhaust pipe 47. Here, note that the stand-by state means a state prior to the substrate introducing step in which a substrate is introduced into the reaction tube 51. Also, though not illustrated, during the substrate introducing step, all the gas feed ports are closed by the corresponding valves 61, 62 and all the gas exhaust ports are opened by the corresponding valves 63, 64 so that the reaction tube 51 is exhausted or vacuum drawn by the discharge pump (DP) from the exhaust ports via the exhaust pipe 47 so as to keep the interior of the reaction tube 51 at a desired pressure.

FIG. 7(*b*) shows the flow of a gas in the apparatus during the substrate heating step. In the substrate heating step, a nitrogen gas supplied from the back-side feed port passes the reaction tube 51 substantially in parallel with the substrate disposed therein to be discharged from the front-side exhaust port, as indicated by an arrow in FIG. 7(*b*). At this time, the valves 61, 64 are opened, whereas the valves 62, 63 are closed.

Subsequently, as shown in FIG. 7(*c*), an oxygen gas is supplied to the reaction tube 51. The flow of the oxygen gas thus supplied is the same as that of FIG. 7(*b*) referred to above. After the supply of the oxygen gas, the substrate heating step is also finished, and the control process proceeds to the following film forming step.

FIGS. 8(*a*) through 8(*e*) illustrate the states of ventilation or gas flows in the reaction tube during the film forming step.

In FIG. 8(*a*), a gas flow through the apparatus in a first stage of the film forming step is shown. A film-forming gas comprising oxygen and evaporated penta-ethoxy-tantalum is supplied, together with a carrier gas in the form of a nitrogen gas, to the heated reaction tube 51 and thermally decomposed there to form a tantalum oxide film on the substrate (not shown). At this time, the flow of the film-forming gas is the same as that of FIG. 7(*b*), but with the valve 61 being fully opened.

Subsequently, as shown in FIG. 8(*b*), the valves 61 through 64 are all opened so that a film-forming gas flows from the back-side feed port to the back-side exhaust port, and another film-forming gas flows from the front-side feed port to the front-side exhaust port. Such valve opening operations are carried out in order to allow, in a second stage of the film forming step following the first stage thereof, a fresh film-forming gas to flow in a direction opposite that in the first stage.

FIG. 8(*c*) shows the flow of a gas through the apparatus in the second stage of the film forming step. In this figure, a film-forming gas together with a carrier gas in the form of a nitrogen gas is supplied to the heated reaction tube 51 and thermally decomposed there to form a tantalum oxide film on the unillustrated substrate. In the second stage of the film forming step, the film-forming gas supplied from the front-side feed port passes the interior of the reaction tube 51 substantially in parallel with the substrate therein to be exhausted from the back-side exhaust port, as indicated by arrows in FIG. 8(*c*), At this time, the valves 62, 63 are opened (in particular, valve 62 is fully opened), whereas the valves 61, 64 are closed.

After the film formation has finished, as shown in FIG. 8(*d*), the valves 61, 62 are closed and the valves 63, 64 are opened so that a residual gas in the reaction tube 51 is discharged by means of the discharge pump (DP) from the back-side exhaust port and the front-side exhaust port to the outside of the reaction tube 51 through the exhaust pipe 47.

Finally, as shown in FIG. 8(*e*), a nitrogen gas is supplied to the reaction tube 51, as in the stand-by state of FIG. 7(*a*), and the entire process is over. Though not shown, during a substrate taking-out step in which the substrate having the films thus formed is taken out of the reaction tube 51, all the valves 61, 62 for the gas feed ports are closed and the interior of the reaction tube 51 is discharged or vacuum drawn from the exhaust ports by means of the discharge pump (DP) so as to be at a desired pressure.

With the above-mentioned conventional film forming method, however, a problem arises in that when a tantalum oxide film is to be formed on a substrate for example, it is difficult to provide such a tantalum oxide film uniformly on the substrate. For example, in an attempt to form a tantalum oxide film on a substrate according to the aforesaid film-forming recipe by using the semiconductor processing apparatus as disclosed in the above-mentioned Japanese Patent Application Laid-Open No. Hei 7-94419, residual components of a film-forming gas which had adhered to the back-side exhaust port are liable to diffuse and flow back into the reaction chamber as a film-forming gas during the substrate heating step, thus resulting in the formation of a thick tantalum oxide film on a portion of the substrate near the back-side exhaust port.

Moreover, another problem is that upon removing the residual gas after the film forming step, as well as during the substrate introducing step and during the substrate taking-out step, the residual components of the film-forming gas attached to the gas exhaust ports are apt to diffuse and flow back into the reaction chamber as a film-forming gas, thus being deposited on the substrate and deteriorating the uniformity in the film thickness. This is because, even if the reaction chamber is discharged or exhausted through vacuum drawing with no gas being supplied thereto, it is difficult to prevent a reverse diffusion into the reaction chamber of the film-forming gas components remaining in the gas exhaust ports to any satisfactory manner.

SUMMARY OF THE INVENTION

Accordingly, the object of the present invention is to provide a novel and improved film forming method which is capable of uniformly forming a film over a surface of a substrate.

Bearing the above object in mind, according to one aspect of the present invention, there is provided a method for producing a semiconductor device, which comprises: introducing a substrate into a reaction chamber which has at least one gas feed port and at least one gas exhaust port; heating the substrate in the reaction chamber to substantially a film forming temperature while supplying a prescribed gas to the reaction chamber through the at least one gas feed port and exhausting the prescribed gas from the reaction chamber through all the exhaust ports; supplying a film-forming gas to the reaction chamber to form a film on the substrate; and taking the substrate with the film formed thereon out of the reaction chamber.

With the above method, it is possible to prevent components of the film-forming gas remaining in the exhaust ports from flowing back into the reaction chamber as a film-forming gas, thereby obviating the above-mentioned conventional problem that a thick film of tantalum oxide is formed on a portion of the substrate near the exhaust ports. Thus, the film formed on the substrate becomes uniform.

In a preferred form of the invention, in the substrate introducing step and the substrate taking-out step, a prescribed gas is supplied from the at least one gas feed port to the reaction chamber while being exhausted from the reaction chamber through all the exhaust ports.

With this arrangement, in the substrate introducing step and the substrate taking-out, i.e., from the time when the substrate is introduced into the reaction chamber until it is taken out therefrom, except for the film forming step, it is possible to prevent the film-forming gas remaining in the exhaust ports from diffusing and flowing back into the reaction chamber as a film-forming gas, thus ensuring a more uniform formation of the film on the substrate.

In another preferred form of the invention, the method further comprises a residual gas removing step for removing a residual gas remaining in the reaction chamber after formation of the film on the substrate between the film forming step and the substrate taking-out step. In the residual gas removing step, a prescribed gas is supplied to the reaction chamber from the at least one gas feed port while being exhausted from the reaction chamber through all the exhaust ports.

With this arrangement, in the case where the residual gas removing step is provided, after the film forming step, for removing the residual gas in the reaction chamber, a reverse diffusion into the reaction chamber of the film-forming gas components remaining in the exhaust ports can effectively be precluded in the residual gas removing step as well, resulting in a uniform film formation on the substrate.

In a further preferred form of the invention, the method further comprises supplying a prescribed gas to the reaction chamber from the at least one gas feed port while exhausting the prescribed gas from the reaction chamber through all the exhaust ports before the substrate introducing step and after the substrate taking-out step.

With this arrangement, before the substrate introducing step and after the substrate taking-out step in which there is no substrate in the reaction chamber, the film-forming gas components remaining in the exhaust ports can be prevented from diffusing back into the reaction chamber. That is, except for the film forming step, such a condition is maintained, thereby making the film formed on the substrate more and more uniform.

In another preferred form of the invention, the at least one exhaust port comprises a plurality of exhaust ports.

Even in such a case, the film-forming gas components remaining in the exhaust ports are prevented from diffusing and flowing back into the reaction chamber as a film-forming gas, making the film formed on the substrate uniform.

In a further preferred form of the invention, the substrate having a film-forming surface is positioned in the reaction chamber substantially horizontally with the at least one gas feed port and the at least one exhaust port being relation opposed relation with respect to each other with the substrate interposed therebetween, whereby the film-forming gas flows substantially in parallel with the film-forming surface of the substrate in the film forming step.

In the aforementioned film forming apparatus of the sheet-fed type, the substrate is greatly influenced by a reverse diffusion into the reaction chamber of the film-forming gas components remaining in the exhaust ports. With the above arrangement, however, it is possible to preclude the film-forming gas components remaining in the exhaust ports from flowing into the reaction chamber, thereby making the film formed on the substrate uniform.

In a further preferred form of the invention, in the film forming step, the film-forming gas is supplied to the reaction chamber a predetermined number of times while changing the direction of flow of the film-forming gas.

With this arrangement, a uniform formation of the film on the substrate can readily be attained irrespective of the direction of flow of the film-forming gas.

In a further preferred form of the invention, immediately before and similar to the film forming step, a prescribed gas is supplied to the reaction chamber from the gas feed port to pass it along the film-forming surface of the substrate substantially in parallel therewith, while being exhausted from the reaction chamber through the exhaust port.

With this arrangement, turbulence of the film-forming gas at the beginning of film formation can effectively be prevented, enabling more uniform formation of the film on the substrate.

In a further preferred form of the invention, the temperature of a portion of the reaction chamber which adjoins the gas feed port supplying the prescribed gas is different from the temperature of the remaining portion thereof.

In forming a film on a substrate using the aforementioned prior art film forming method, there is a tendency for a portion of the substrate near an exhaust port which is not exhausted immediately before a film forming step for example, i.e., a substrate surface adjacent a gas feed port supplying a prescribed gas, to become thick. With the above arrangement, however, the temperature of the substrate surface near the gas feed port can be made slightly lower than that of the remaining portion thereof for example, so the film-forming speed at that portion of the substrate surface near the gas feed port can be controlled appropriately, making it possible to adjust the film thickness during the film forming step and hence to form a much more uniform film on the substrate.

In a further preferred form of the invention, the temperature of a portion of the reaction chamber which adjoins the gas feed port supplying the prescribed gas is lower than the temperature of the remaining portion thereof.

In the formation of a film on a substrate according to the aforementioned prior art film forming method, there is also a tendency for a portion of the substrate near an exhaust port which is not exhausted immediately before a film forming step for example, i.e., a substrate surface adjacent a gas feed port supplying a prescribed gas, to become thick. With the above arrangement, however, the temperature of the substrate surface near the gas feed port can be made slightly lower than that of the remaining portion thereof for example, so the film-forming speed can be made a little slower at that portion of the substrate surface near the gas feed port than at the remaining portion thereof, allowing adjustment of the film thickness in the film forming step and hence enabling a much more uniform film formation on the substrate.

In a further preferred form of the invention, the film-forming gas is a gas mixture containing a plurality of kinds of gases, the gas mixture containing at least one kind of a nonreactive gas which is by itself unable to form a film on the substrate, the nonreactive gas being used as the prescribed gas.

The use of the prescribed gas in the form of a nonreactive gas, which is by itself unable to form a film on the substrate, does not at all have any adverse effects on the substrate. Moreover, the nonreactive gas does not adhere to the exhaust ports, so a reverse flow into the reaction chamber of the film-forming gas adhered to the exhaust ports due to the diffusion thereof can be precluded, thus making the film formation on the substrate uniform.

In a further preferred form of the invention, the gas mixture contains a first gas which is in a gaseous state at room temperature and a second gas which is in a liquid state at room temperature, the first gas being used as the prescribed gas.

Using the prescribed gas in the form of a gas that is in a gaseous state at room temperature does not have any adverse effects on the substrate. In addition, such a gas does not adhere to the exhaust ports, so a reverse flow into the reaction chamber of the film-forming gas adhered to the exhaust ports due to the diffusion thereof can be precluded, thus ensuring the formation of the uniform film on the substrate.

In a further preferred form of the invention, the prescribed gas is an inert gas which is unable to form a film on the substrate.

Using the prescribed gas in the form of an inert gas does not have any adverse effects on the substrate, and the inert gas does not adhere to the exhaust ports, and does not cause undesirable reactions with film-forming gas components. Consequently, a reverse flow into the reaction chamber of the film-forming gas adhered to the exhaust ports can be precluded, thus making the film formed on the substrate uniform.

In a further preferred form of the invention, the film-forming gas contains at least penta-ethoxy-tantalum, which provides marked effects.

That is, in the case where the film-forming gas contains penta-ethoxy-tantalum, a tantalum residual component of the penta-ethoxy-tantalum gas is liable to collect in the interior of the exhaust ports. In this case, however, it is possible to prevent a reverse diffusion into the reaction chamber of the residual component, thereby ensuring a uniform formation of a tantalum oxide film on the substrate.

According to another aspect of the present invention, there is provided a method for producing a semiconductor device, the method comprising: introducing a substrate into a reaction chamber which has at least one gas feed port and at least one gas exhaust port; heating the substrate in the reaction chamber to substantially a film forming temperature; supplying a film-forming gas to the reaction chamber to form a film on the substrate; removing a residual gas remaining in the reaction chamber after formation of the film on the substrate while supplying a prescribed gas to the reaction chamber from the at least one gas feed port by exhausting the prescribed gas from the reaction chamber through all the exhaust ports; and taking the substrate with the film formed thereon out of the reaction chamber.

With this method, it is possible to prevent the film-forming gas components adhered to the exhaust ports from diffusing and flowing back into the reaction chamber, thus making the film formed on the substrate uniform.

According to a further aspect of the present invention, there is provided an apparatus for producing a semiconductor device, the apparatus comprising: a reaction chamber having at least one gas feed port and at least one exhaust port; valves for opening and closing the at least one gas feed port and the at least one exhaust port; a gas supply system for supplying a prescribed gas to the reaction chamber from the at least one gas feed port; and a heater for heating the substrate in the reaction chamber to substantially a film forming temperature. At least in a substrate heating step in which said substrate is heated to substantially the film-forming temperature by said heater, or in a residual gas removing step in which a residual gas remaining in said reaction chamber is removed after a film forming step, the prescribed gas is supplied to the reaction chamber from the at least one gas feed port while being exhausted from the reaction chamber through all the exhaust ports.

With this arrangement, it is possible to prevent the film-forming gas components remaining in the exhaust ports from flowing back into the reaction chamber as a film-forming gas, thus making the film formed on the substrate uniform.

Here, note that Japanese patent No. 2809817 discloses a means for preventing by-products from collecting in a gas feed pipe, and Japanese Patent Application Laid-Open Nos. Hei 7-14773 and Hei 8-31743 disclose a means for preventing contaminating substances such as particles and the like from flowing back into a reaction chamber. These prior art references, however, do not teach or suggest at all preventing a film-forming gas remaining in a gas exhaust port from flowing back into a reaction chamber.

The above and other objects, features and advantages of the invention will become more readily apparent from the following detailed description of the invention when taken in conjunction with the accompanying drawings.

BRIEF DESCRIPTION OF THE DRAWINGS

FIGS. 1(*a*) through 1(*c*) are views illustrating ventilation states of a gas during a substrate heating step and immediately before forming a film according to the present invention.

FIGS. 2(*a*) and 2(*b*) are views illustrating trends of residual gas components of a film-forming gas remaining in the gas exhaust ports according to the present invention and a prior art method, respectively.

FIGS. 7(*a*) through 7(*c*) are views illustrating ventilation (flowing) states of a gas in the reaction tube from a standby state up to the end of a substrate heating step according to the prior art.

FIGS. 8(*a*) through 8(*e*) are views illustrating ventilation (flowing) states of a gas in the reaction tube during a film forming step and the like according to the present invention and the prior art.

DESCRIPTION OF THE PREFERRED EMBODIMENTS

Now, preferred embodiments of the present invention will be described in detail while referring to the accompanying drawings.

A method for producing a semiconductor device according to the present invention includes, similar to the aforementioned conventional technology, introducing a substrate into a reaction chamber, heating the substrate in the reaction chamber to substantially a film forming temperature, supplying a film-forming gas to the reaction chamber to form a film or films on a surface of the substrate, and taking out the substrate with the film(s) formed thereon from the reaction chamber.

Here, note that the reaction chamber may be equipped with at least one gas feed port and at least one gas exhaust port with any conditions other than this being not particularly limited. Specifically, the present invention can be implemented by using a variety of conventional film forming apparatuses as referred to above, which includes a reaction chamber or tube capable of receiving a substrate and provided with at least one gas feed port and at least one gas exhaust port, valves for opening and closing the at least one gas feed port and the at least one gas exhaust port, a valve for supplying a prescribed gas to the reaction chamber from the at least one gas feed port, and a heater for heating the substrate in the reaction chamber to substantially a film forming temperature. Concretely, some examples of such equipment use in implementing the present invention are ones as shown in FIG. 5 and FIG. 6, respectively. In this case, as illustrated in FIG. 6, a plurality of gas feed ports and exhaust ports may be provided.

The present invention is featured in that at least during a substrate heating step, a prescribed gas is supplied to the reaction chamber from the at least one gas feed port while the prescribed gas is being exhausted from the reaction chamber through the one gas exhaust port or all the gas exhaust ports (if there are a plurality of gas exhaust ports). The prescribed gas referred to herein can be arbitrarily selected depending upon the type of a film(s) formed on a substrate, and hence is not limited at all. For example, the prescribed gas can be an inert gas which by itself is unable to form any film on a substrate.

The, the present invention is further unique in that a residual gas removing step is provided between the film forming step and the substrate taking-out step, for removing a residual gas which exists in the reaction chamber after the film forming step. During the residual gas removing step, a prescribed gas is exhausted from the reaction chamber through all the exhaust ports while the prescribed gas is being supplied to the reaction chamber from the at least one gas feed port.

As described above, although in the present invention a prescribed gas may be supplied to the reaction chamber from the at least one gas feed port while the prescribed gas may be being exhausted from the reaction chamber through all the exhaust ports at least during the substrate heating step or during the residual gas removing step, it is preferred that supplying a prescribed gas to the reaction chamber while exhausting it therefrom in the above manner before and during the substrate introducing step as well as during and after the substrate taking-out step be carried out, resulting in the formation of a much more uniform film.

The substrate heating step according to the present invention is to heat a substrate to a desired temperature by means of an appropriate heater so as to make a surface thereof uniform prior to forming a film thereon. Preferably, the heater is an electric resistance heater, and a heating system of a hot wall type is desirable which can hold the temperature of the reaction chamber to a desired level prior to introducing the substrate. Of course, the heater may be a lamp, a high frequency heater or oscillator, etc.

The film forming step of the present invention may be carried out by use of any film forming means or apparatus which can form a desired film or films on the substrate. In the present invention, however, particularly remarkable effects or advantages will be attained when the film forming step is carried out by using a film forming apparatus of a sheet-fed type in which a substrate is disposed substantially horizontally in the reaction chamber with the at least one gas feed port and the at least one exhaust port being positioned in an opposed relation with respect to each other with a film-forming surface of the substrate interposed therebetween, so that a film-forming gas can flow along the film-forming surface of the substrate substantially in a parallel relation. That is, the substrate tends to be greatly influenced by a reverse diffusion into the reaction chamber of the film-forming gas remaining in the gas exhaust ports, but according to the present invention, the film-forming gas remaining in the gas exhaust ports is prevented from flowing back into the reaction chamber, thereby enabling a uniform formation of a film on the substrate. Moreover, in the case of performing the film forming step by using such a film forming apparatus of the sheet-fed type, it is preferable to supply the film-forming gas at a predetermined number of times while alternately changing the direction of flow of the film-forming gas. It is further preferable that a prescribed gas be supplied, immediately before the film forming step, to the reaction chamber from the at least one gas feed port and then discharged from the exhaust port as in the film forming step. In this regard, it is still preferable to set the temperature of a portion of the reaction chamber which is adjacent the gas feed port supplying the prescribed gas to a predetermined value different from the temperature of the remaining portion thereof. For example, preferably, the temperature of the portions of the reaction chamber adjacent or near the gas feed port supplying the prescribed gas is set to a predetermined value slightly lower than the temperature of the remaining portion thereof. The portion of the substrate adjacent or near the gas feed port supplying the prescribed gas is liable to be influenced by a reverse diffusion of the film-forming gas from the exhaust ports, so a film formed on the substrate tends to become thicker at locations adjacent the gas feed port supplying the prescribed gas than at the other locations. As a consequence, by setting the temperature of the substrate surface near the gas feed port supplying the prescribed gas to a value slightly lower than that of the remaining portion thereof, the speed of film formation becomes slightly less at a portion of the substrate near the gas feed port supplying the prescribed gas than at the remaining portion thereof, thus achieving the formation of a more uniform film over the surface of the substrate.

Here, it is to be noted that the film-forming gas may be a gas mixture containing a plurality of kinds of gases. Specifically, such a gas mixture may contain at least one kind of nonreactive gas which is by itself unable to perform a film formation with the substrate. Further, the gas mixture may contain a gas which is in a gaseous state at room temperature, and a gas which is in a liquid state at room temperature. The prescribed gas may be the nonreactive gas or the gas which is in a liquid state at room temperature. Also, the prescribed gas may be an inert gas, which is preferred from a view point that there will be any undesired reactions with film-forming gas components.

Now, the present invention will be described in detail in a case wherein tantalum oxide films are formed on a substrate. Here, it is needless to say that a method for producing a semiconductor device and a semiconductor producing apparatus according to the present invention are not limited to the following method and apparatus for forming a tantalum oxide film as described herein.

As previously described with reference to FIG. 5, a liquid of penta-ethoxy-tantalum $(Ta(OC_2H_5)_5)$, which is in a liquid state at room temperature, is received in a tank 41 which is disposed in a thermostatic chamber 42. The temperature of the tank 41 is controlled to be at a predetermined temperature such as, for example, 35 degrees C by means of the thermostatic chamber 42. A nitrogen gas supplied from a nitrogen feed pipe 48 to the tank 41 pressurizes the interior of the tank 41, whereby the penta-ethoxy-tantalum liquid is pushed out of the tank 41 into the material feed pipe 49. The penta-ethoxy-tantalum in the liquid state is supplied from the material feed pipe 49 to a carburetor 43, and a nitrogen carrier gas is also supplied from a nitrogen feed pipe 48 to the carburetor 43. A film-forming gas evaporated from the penta-ethoxy-tantalum liquid by the carburetor 43 is introduced, together with the nitrogen carrier gas, into a reaction chamber 45 through a feed pipe 44. Simultaneous with this, an oxygen gas is also introduced from an oxygen tank (not shown) into the reaction chamber 45 wherein the penta-ethoxy-tantalum is thermally decomposed to form a tantalum oxide film on the substrate. After the formation of the film, the atmosphere in the reaction chamber 45 is discharged through an exhaust pipe 47 by means of a discharge pump 46.

According to the present invention, as long as the reaction chamber 45 is provided with at least one gas feed port and at least one exhaust port, the configuration of the reaction chamber 45 may be optional and hence can be the same as in the prior art. For example, the reaction chamber 45 can be similar to the reaction tube as referred to in the aforesaid Japanese Patent Application Laid-Open No. 7-94419 and shown in FIG. 6. Thus, the reaction chamber 45 may be constructed such that a substrate (not shown) is horizontally disposed substantially in the center of the reaction chamber with gas feed ports and gas exhaust ports being provided at opposite ends of the reaction chamber in an opposed relation with respect to each other with the substrate interposed therebetween, as in the gas feed ports 52, 53 and the gas exhaust ports 54, 55 of the reaction tube 51.

The present invention is further featured in that at least in a substrate heating step, a prescribed gas is supplied to the reaction chamber from at least one gas feed port and discharged to the outside from all the exhaust ports.

Figure 1A:
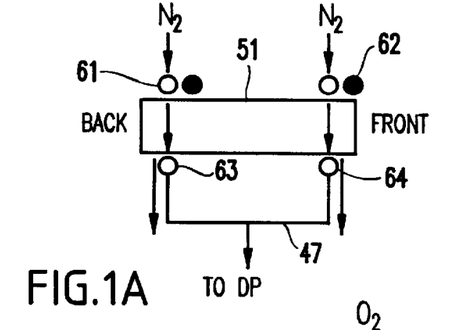
Figure 1B:
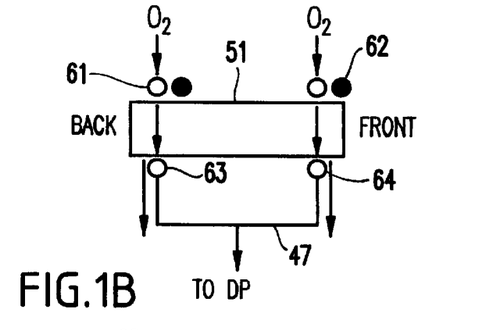
Figure 1C:
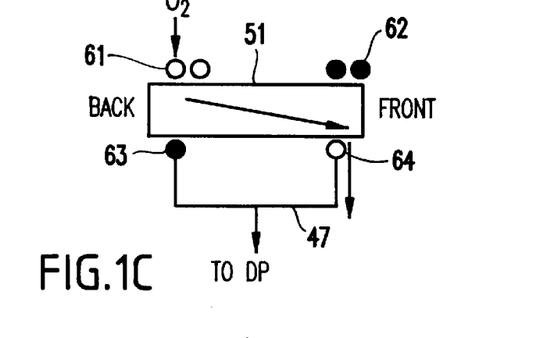

FIGS. 1(a) through 1(c) illustrate the flowing states of the prescribed gas during the substrate heating step and immediately before the formation of a film, according to the present invention. In these figures, the reaction chamber takes the form of a reaction tube 51 having at its opposite ends a back-side feed port with a valve 61 and a front-side feed port with a valve 62 as well as a back-side exhaust port with a valve 63 and a front-side exhaust port with a valve 64.

FIG. 1(a) shows the flow of the prescribed gas in a standby state of the apparatus. In the standby state of FIG. 1(a), valves 61 through 64 are adjusted in such a manner that a nitrogen gas flows in a direction from the back-side feed port to the back-side exhaust port, and from the front-side feed port to the front-side exhaust port. The gas is supplied from the back-side and front-side feed ports to the reaction tube 51, passes there and is discharged to the outside by means of a discharge pump (DP) through an exhaust pipe 47, as indicated by arrows in FIG. 1(a). Here, note that the standby state of the apparatus may be during or before the substrate introducing step in which the substrate is introduced into the reaction tube 51, or it may be a state in which the substrate is disposed in the reaction tube 51 prior to the substrate heating step. Moreover, the prescribed gas in the standby state is a nitrogen gas, which is an inert gas unable to form by itself a film on the substrate.

FIG. 1(b) shows a gas flow in the apparatus during the substrate heating step. In the substrate heating step of the reaction tube 51, an oxygen gas supplied from the back-side feed port to the reaction tube 51 proceeds to the back-side exhaust port directly opposing the back-side feed port, and discharged therefrom to the outside, as shown by arrows in FIG. 1(b). Similarly, an oxygen gas supplied from the front-side feed port to the reaction tube 51 proceeds to the front-side exhaust port directly opposing the front-side feed port, and discharged therefrom to the outside. At this time, the valves 61 through 64 are all opened. The prescribed gas in the substrate heating step is the oxygen gas. The oxygen gas is supplied, together with an evaporated penta-ethoxy-tantalum gas, to the reaction chamber, but it is unable to form by itself a film on the substrate, and thus called "a nonreactive gas" in this specification.

FIG. 1(c) shows the flow of gas immediately before the formation of a film during the substrate heating step. The oxygen gas supplied from the back-side feed port to the reaction tube 51 passes through the interior of the reaction tube 51 substantially in parallel with the substrate, and discharged therefrom to the outside through the front-side exhaust port, as indicated at arrows in FIG. 1(c). At this time, the valves 61, 64 are opened (in particular, valve 61 is fully opened), whereas the valves 62, 63 are closed. After the supply of the oxygen gas, the substrate heating step is completed, and the process proceeds to the following film forming step. In this regard, it is desired that the period of time, in which the gas is forced to flow along the substrate substantially in parallel therewith immediately before the film formation as described above, is as short as possible. Even in such a short time, however, there is a possibility that film-forming gas components remaining in the back-side exhaust port flow back therefrom and diffuse into the reaction tube 51 from the back-side exhaust port which is not exhausted at that time. In this case, the film formed on the substrate has a tendency that the thickness of the film becomes greater at a portion of the substrate near the back-side exhaust port which is not exhausted immediately before the film forming step, i.e., at a substrate surface near the back-side feed port from which the prescribed gas is supplied, than at the other portion thereof. In order to improve this, the temperature of the reaction tube 51 in the vicinity of the back-side feed port is adjusted relative to the temperature of the other portion thereof. For example, the temperature of a portion of the reaction chamber near the back-side feed port is set to a value slightly less than the temperature of the other portion thereof. As a result, the surface temperature of the substrate near the back-side feed port becomes slightly lower than that of the other portion thereof, and hence the speed of film formation at that portion reduces slightly with respect to the other portion thereof, so that an increase in the film thickness near the back-side feed port in the film forming step can be properly adjusted.

Figure 8A:
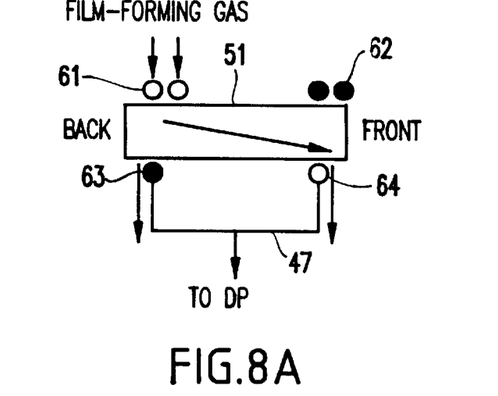

The film forming step of the present invention can be carried out in the same manner as in the prior art. Specifically, as illustrated in FIG. 8(a), in a first stage of the film forming step, a film-forming gas comprising an oxygen gas and an evaporated penta-ethoxy-tantalum gas is supplied to the reaction tube 51 together with a carrier gas such as a nitrogen gas. According to this embodiment, the film-forming gas may be a gas mixture containing a plurality of kinds of gases, and the oxygen gas corresponds to a nonreactive gas. In this connection, note that oxygen is in a gaseous state at room temperature but penta-ethoxy-tantalum is in a liquid state at room temperature. Then, the film-forming gas is heated and thermally decomposed in the reaction tube 51 to form a tantalum oxide film on the substrate. At this time, as indicated at arrows in FIG. 8(a), the film-forming gas is supplied from the back-side feed port to the reaction tube 51 to pass along the substrate substantially in parallel therewith, and discharged therefrom through the front-side exhaust port. During this process, the valves 61, 64 are opened (valve 61 is fully opened), whereas the valves 62, 63 are closed.

Figure 8B:
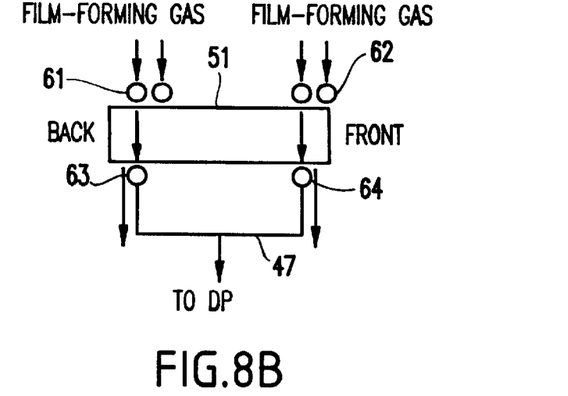

Subsequently, as illustrated in FIG. 8(b), the apparatus is set such that the valves 61 through 64 are all opened, whereby the film-forming gas flows from the back-side feed port to the back-side exhaust port and at the same time from the front-side feed port to the front-side exhaust port. Such an operation is carried out in view of the fact that in the following second stage of the film forming step, the film-forming gas is forced to flow in a direction reverse to the flowing direction thereof in the first stage of the film forming step.

Figure 8C:
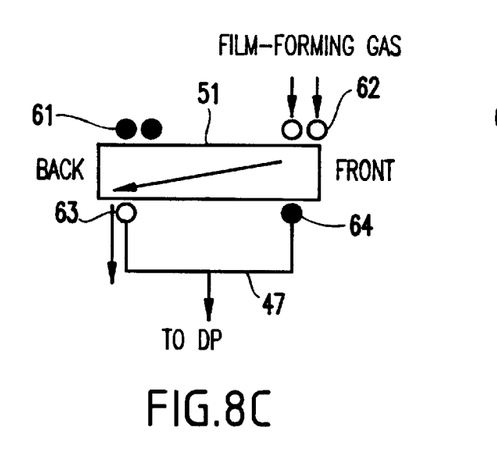

Thereafter, as illustrated in FIG. 8(c), the film-forming gas together with a carrier gas such as a nitrogen gas is supplied to the reaction tube 51 and thermally decomposed there to form a new or further tantalum oxide film on the substrate. In the second stage of the film forming step, as indicated at arrows in FIG. 8(c), the film-forming gas supplied from the front-side feed port passes the interior of the reaction tube 51 substantially in parallel with the substrate and discharged from the back-side exhaust port. At this time, the valves 62, 63 are opened (valve 62 is fully opened), whereas the valves 61, 64 are closed.

Figure 8D:
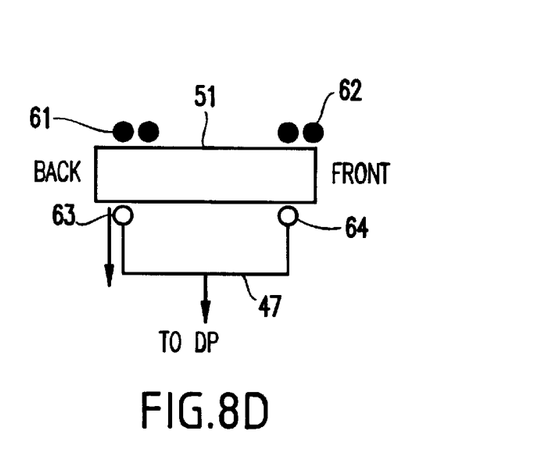
Figure 8E:
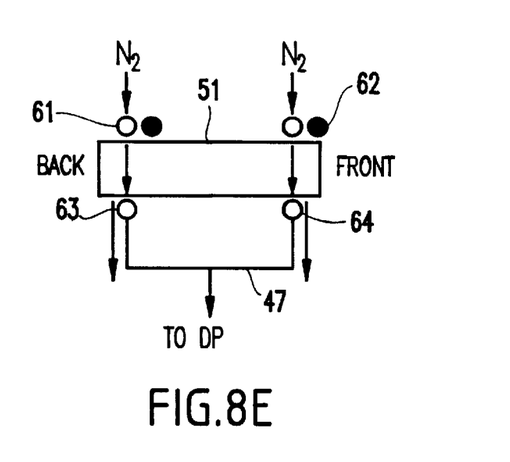

After the film forming step has been finished, a residual gas removing step is performed, as shown in FIG. 8(e). Specifically, similar to the standby state of FIG. 1(a), a nitrogen gas is fed to the reaction tube 51 while at the same time the interior of the reaction tube 51 is exhausted from all the exhaust ports, whereby a residual gas in the reaction tube 51 can be removed, and thus the entire process is finished.

Here, it is preferable that during and after the substrate taking-out step in which the substrate processed in the above manner is taken out of the reaction tube 51, a prescribed gas is supplied to the reaction tube 51 from at least one gas feed port while the reaction tube 51 is exhausted from all the gas exhaust ports.

As described above, according to the tantalum oxide film forming method of the present invention, during the substrate heating step, the residual gas removing step or the like, a gas is ventilated or passed from the gas feed ports to the gas exhaust ports which are disposed in opposition to the gas feed ports, e.g., from the back-side feed port to the back-side exhaust port and from the front-side feed port to the front-side exhaust port. With this arrangement, the film-forming gas components remaining in the gas exhaust ports can be prevented from diffusing back into the reaction chamber, thus enabling a uniform formation of thin films on the substrate.

Figure 2A:
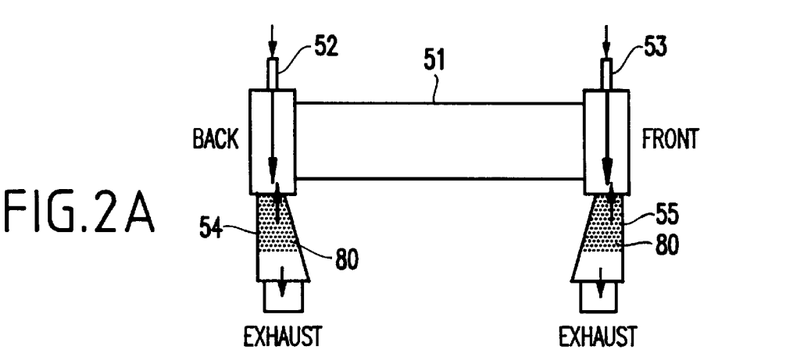
Figure 2B:
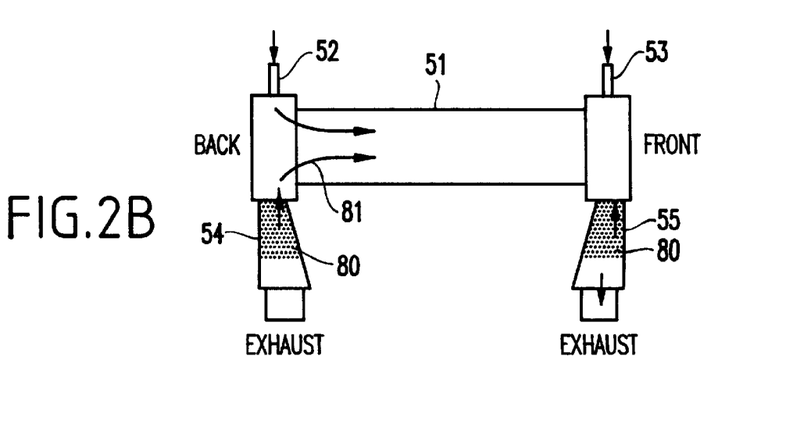

FIGS. 2(a) and 2(b) illustrate trends of the components of the film-forming gas remaining in the gas exhaust ports in the present invention and the prior art, respectively. In general, the film-forming gas remains as residual gas components in the exhaust ports 54, 55 in the vicinity of the reaction tube 51. This phenomenon takes place due to the fact that the temperature of the gas exhaust ports 54, 55 is lower than that of the reaction tube 51.

FIG. 2(a) shows an embodiment of a method for forming a tantalum oxide film according to the present invention, in which during the substrate heating step, ventilation is carried out, for example, from the back-side feed port to the back-side exhaust port and the front-side feed port to the front-side exhaust port, whereby a reverse diffusion into the reaction tube 51 of residual gas components 80 can be positively prevented. In this connection, it goes without saying that the reaction tube 51 may be exhausted through all the exhaust ports while being supplied with the prescribed gas from either one of the gas feed ports, thus providing the same effects.

In contrast to this, according to the prior art shown in FIG. 2(b), during the substrate heating step, ventilation is performed from a back-side feed port to a front-side exhaust port, and hence residual gas components 80 in the back-side exhaust port will diffuse back in a direction indicated at arrows 81 to invade into the reaction tube 51, with the result that a tantalum oxide film is formed on the substrate thicker in a portion thereof near the back-side feed port than the remaining portion thereof. Japanese Patent Application Laid-Open No. 7-94419, referred to above, does not make any mention of a gas flow in the substrate heating step prior to the film forming step.

Moreover, in this prior art, after the end of the film forming step, a residual gas in the reaction tube 51 is removed in a way as shown in FIG. 8(d), so the residual gas components in the exhaust ports will diffuse back into the reaction tube 51 during the residual gas removing step as well, thereby deteriorating the uniformity in the film thickness. In addition, in the substrate introducing step and the substrate taking-out step, the reaction tube 51 is exhausted by means of a discharge pump so as to be at a desired pressure with all the gas feed ports closed, as a consequence of which a similar reverse diffusion of the residual gas components will take place from the exhaust ports to the reaction tube 51, resulting in a nonuniform thickness in the films formed.

The present invention can be particularly effectively applied to the formation of tantalum oxide films. This is because tantalum residual components of the penta-ethoxy-tantalum gas or vapor contained in the film-forming gas are liable to collect in the interiors of the exhaust ports 54, 55. Also, it is of course possible to use the method of the present invention in cases where another kind of film-forming gas is employed. Further, the introduction pressure, introduction temperature, introduction time, introduction amount or flow rate, exhausting pressure, exhausting time and the like of the film-forming gas or the prescribed gas, selection of the prescribed gas and the carrier gas, the temperature employed in the substrate heating step, the extent or degree of opening or closing of the valves, etc., may be arbitrarily selected or made while taking account of the kind of a film to be formed, the scale or size of the film forming apparatus employed, and so on.

Figure 3:
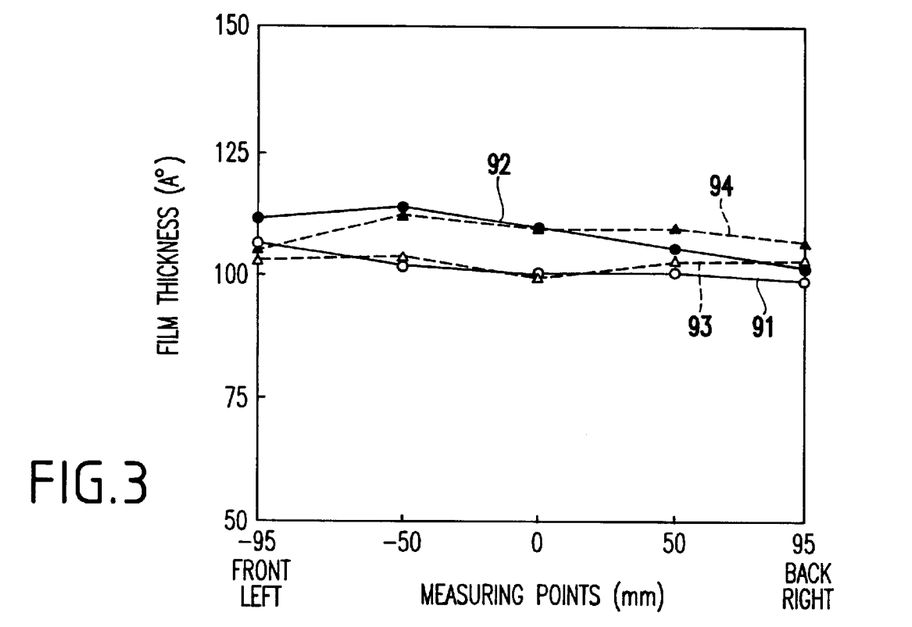
FIG. 3 is a view illustrating uniformity in the film thickness in the case where tantalum oxide films are formed on two substrates which are stacked in a vertical direction and held in position in a reaction tube, according the present invention.

FIG. 3 illustrates the uniformity in the thickness of thin films when the present invention is applied to forming an tantalum oxide film on each of two substrates which are stacked one over the other in a vertical direction and held in position in the reaction tube.

As shown in FIG. 3, the center of an upper one of the substrates was selected as a reference point of measurement (0 mm), at which the thickness (angstrom) of thin films on the upper substrate was measured. Further, additional measurements were effected at points (indicated at "−50 mm" and "−95 mm" in FIG. 3) of the upper substrate respectively away from the reference point (0 mm) distances of 50 mm and 95 mm in a front-side direction, and at points (indicated at "50 mm" and "95 mm" in FIG. 3) of the upper substrate respectively away from the reference point (0 mm) distances of 50 mm and 95 mm in a back-side direction. The results of these measurement are indicated at a solid line 91 in FIG. 3. Similar measurements were also made with respect to a lower substrate, and the results of these measurements are indicated at a solid line 92 in FIG. 3. Moreover, similar measurements were effected with respect to a direction (i.e., a left-side to right-side direction) perpendicular to the front-side to back-side direction, and the results thereof are indicated at a broken line 93 for the upper substrate and at a broken line 94 for the lower substrate with a left-side direction and a right-side direction from the reference point (0 mm) designated by "Left" and "Right", respectively, in FIG. 3. From the illustration of FIG. 3, it has been found that by applying the present invention, there could be formed substantially uniform thin layers or films on the substrate. Uniformity of the films thus formed were in a range of from 3.9 to 4.8%.

Figure 4:
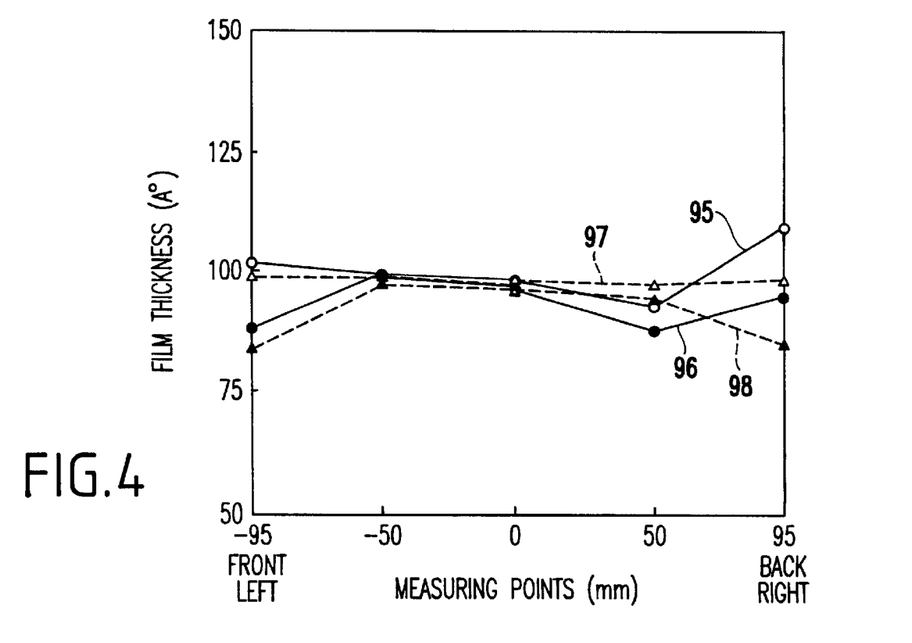
FIG. 4 is a view illustrating uniformity in the film thickness in the case where a tantalum oxide film is formed on each of two substrates which are stacked in a vertical direction and held in position in a reaction tube according to the prior art method.

In contrast, the above-mentioned prior art method did not yield any good results as in the present invention shown in FIG. 3. In fact, FIG. 4 illustrates uniformity in the thickness of tantalum oxide films formed on a substrate by means of the prior art method (i.e., ventilation was effected from the back-side feed port to the front-side exhaust port during the substrate heating step). The film-forming conditions and the film-thickness measuring conditions of FIG. 4 were the same as those of FIG. 3.

From FIG. 4, it has been found that both of solid lines 95, 96 show great variations in the film thickness in the back-side direction and the front-side direction, and hence uniformity in the film thickness has deteriorated. The uniformity or variation of the film thickness was worsened to 8.4 to 8.7%.

As apparent from the foregoing, the present invention can provide a method for producing a semiconductor device and a semiconductor producing apparatus for implementing this method, which are capable of forming a uniform thin layer or film on a substrate.

While the invention has been described in terms of preferred embodiments, those skilled in the art will recognize that the invention can be practiced with modification within the spirit and scope of the appended claims.

What is claimed is:

1. A method for producing a semiconductor device, comprising:

introducing a substrate into a reaction chamber which has at least one gas feed port and at least one gas exhaust port;

heating said substrate in said reaction chamber to a film-forming temperature while supplying a prescribed gas to said reaction chamber through said at least one gas feed port and exhausting said prescribed gas from said reaction chamber through said at least one gas exhaust port before supplying a film-forming gas to said reaction chamber;

supplying a film-forming gas to said reaction chamber to form a film on said substrate; and taking said substrate with said film formed thereon out of said reaction chamber, wherein said prescribed gas comprises a non-film-forming gas.

2. The method for producing a semiconductor device according to claim 1, wherein in said substrate introducing step and said substrate taking-out step, a prescribed gas reaction is supplied from said at least one gas feed port to said reaction chamber while being exhausted from said reaction chamber through said at least one gas exhaust port.

3. The method for producing a semiconductor device according to claim 2, further comprising a residual gas removing step for removing a residual gas remaining in said reaction chamber after formation of said film on said substrate between said film-forming step and said substrate taking-out step, wherein in said residual gas removing step, a prescribed gas is supplied to said reaction chamber from said at least one gas feed port while being exhausted from said reaction chamber through said at least one gas exhaust port.

4. The method for producing a semiconductor device according to claim 2, further comprising supplying a prescribed gas to said reaction chamber from said at least one gas feed port while exhausting said prescribed gas from said reaction chamber through all said exhaust ports before said substrate introducing step and after said substrate taking-out step.

5. The method for producing a semiconductor device according to claim 4, further comprising a residual gas removing step for removing a residual gas remaining in said reaction chamber after formation of said film on said substrate between said film-forming step and said substrate taking-out step, wherein a prescribed gas is supplied to said reaction chamber from said at least one gas feed port while being exhausted from said reaction chamber through said at least one gas exhaust port in said residual gas removing step as well.

6. The method for producing a semiconductor device according to claim 1, wherein said at least one gas exhaust port comprises at least two gas exhaust ports.

7. The method for producing a semiconductor device according to claim 1, wherein said substrate having a film-forming surface is located in said reaction chamber horizontally with said at least one gas feed port and said at least one gas exhaust port being opposed with respect to each other, with said substrate interposed therebetween, and wherein said film-forming gas flows in parallel with said film-forming surface of said substrate in said film-forming step.

8. The method for producing a semiconductor device according to claim 7, wherein said at least one gas exhaust port comprises at least two gas exhaust ports.

9. The method for producing a semiconductor device according to claim 8, wherein in said film-forming step, said film-forming gas is supplied to said reaction chamber while changing the direction of flow of said film-forming gas.

10. The method for producing a semiconductor device according to claim 9, further comprising supplying, immediately before and similar to said film-forming step, a prescribed gas to said reaction chamber from said gas feed port to pass it along said film-forming surface of said substrate in parallel therewith and exhausting said prescribed gas from the reaction chamber through said gas exhaust port.

11. The method for producing a semiconductor device according to claim 10, further comprising making the temperature of a portion of said reaction chamber which adjoins said gas feed port supplying said prescribed gas different from the temperature of the remaining portion thereof.

12. The method for producing a semiconductor device according to claim 11, further comprising making the temperature of a portion of said reaction chamber which adjoins said gas feed port supplying said prescribed gas lower than the temperature of the remaining portion thereof.

13. The method for producing a semiconductor device according to claim 11, wherein said film-forming gas is a gas mixture containing a plurality of kinds of gases, said gas mixture containing at least one kind of a nonreactive gas which is by itself unable to form a film on said substrate, said nonreactive gas being used as said prescribed gas.

14. The method for producing a semiconductor device according to claim 13, wherein said gas mixture contains a first gas which is in a gaseous state at room temperature and a second gas which is in a liquid state at room temperature, said first gas being used as said prescribed gas.

15. The method for producing a semiconductor device according to claim 1, wherein said prescribed gas is an inert gas which is unable to form a film on said substrate.

16. The method for producing a semiconductor device according to claim 1, wherein said film-forming gas contains at least penta-ethoxy-tantalum.

17. A method for producing a semiconductor device, comprising:

introducing a substrate into a reaction chamber which has at least one gas feed port and at least one gas exhaust port;

heating said substrate in said reaction chamber to a film-forming temperature;

supplying a film-forming gas to said reaction chamber to form a film on said substrate;

removing a residual gas remaining in said reaction chamber after formation of said film on said substrate while supplying a prescribed gas to said reaction chamber from said at least one gas feed port while exhausting said prescribed gas from said reaction chamber through said at least one gas exhaust port; and taking said substrate with said film formed thereon out of said reaction chamber, wherein said prescribed gas comprises a non-film-forming gas.

18. A method for producing a semiconductor device, comprising:

introducing a substrate into a reaction chamber which has at least one gas feed port and at least one gas exhaust port;

heating said substrate in said reaction chamber to a film-forming temperature;

supplying a film-forming gas to said reaction chamber to form a film on said substrate; and taking said substrate with said film formed thereon out of said reaction chamber, wherein in said substrate introducing step and said substrate taking-out step, a non-film-forming gas is supplied from said at least one gas feed port to said reaction chamber while being exhausted from said reaction chamber through said at least one gas exhaust port.

19. A method for producing a semiconductor device, comprising:

introducing a substrate into a reaction chamber which has at least one gas feed port and a plurality of gas exhaust ports;

heating said substrate in said reaction chamber to a film-forming temperature while supplying a non-film-forming gas to said reaction chamber through said at least one gas feed port and exhausting said non-film-forming gas from said reaction chamber through all said plurality of exhaust ports before supplying a film-forming gas to said reaction chamber;

supplying a film-forming gas to said reaction chamber to form a film on said substrate; and taking said substrate with said film formed thereon out of said reaction chamber.

* * * * *

UNITED STATES PATENT AND TRADEMARK OFFICE
CERTIFICATE OF CORRECTION

PATENT NO.     : 6,204,199 B1
DATED          : March 20, 2001
INVENTOR(S)    : Masanori Sakai et al.

It is certified that error appears in the above-identified patent and that said Letters Patent is hereby corrected as shown below:

<u>Title page,</u>
Item [73], Assignee, please change the Assignee name to:

-- [73] Hitachi Kokusai Electric Inc., Tokyo Japan --

Signed and Sealed this

Fourteenth Day of January, 2003

JAMES E. ROGAN
*Director of the United States Patent and Trademark Office*